(12) United States Patent
Taraboukhine et al.

(10) Patent No.: US 12,160,243 B2
(45) Date of Patent: Dec. 3, 2024

(54) ALGORITHM FOR ACCURATELY CONVERTING A WIDE RANGE OF PHOTO SIGNALS INTO AN ELECTRICAL CURRENT

(71) Applicant: Applied Materials, Inc., Santa Clara, CA (US)

(72) Inventors: Mikhail Taraboukhine, Pleasanton, CA (US); Oleg Serebryanov, Santa Clara, CA (US); Alexander Goldin, San Jose, CA (US); Vilen Nestorov, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 17/862,278

(22) Filed: Jul. 11, 2022

(65) Prior Publication Data
US 2024/0014825 A1  Jan. 11, 2024

(51) Int. Cl.
*H03M 1/10* (2006.01)
(52) U.S. Cl.
CPC .................. *H03M 1/1014* (2013.01)
(58) Field of Classification Search
CPC .................................................. H03M 1/1014
USPC ......................................... 341/155, 118, 120
See application file for complete search history.

(56) References Cited

U.S. PATENT DOCUMENTS

| | | | |
|---|---|---|---|
| 11,734,556 B2* | 8/2023 | Meng | G06E 1/045 |
| | | | 706/43 |
| 2004/0156420 A1 | 8/2004 | Huston et al. | |
| 2010/0149385 A1 | 6/2010 | Tay | |
| 2016/0178442 A1 | 6/2016 | Murray | |
| 2017/0123036 A1* | 5/2017 | Miyake | G01R 19/0092 |
| 2022/0099714 A1* | 3/2022 | Ye | G01R 31/3865 |

FOREIGN PATENT DOCUMENTS

| | | |
|---|---|---|
| KR | 20130105401 A | 9/2013 |
| WO | 2010059993 A2 | 5/2010 |

OTHER PUBLICATIONS

International Search Report and Written Opinion from PCT/US2023/024359 dated Sep. 20, 2023, 10 pgs.

* cited by examiner

*Primary Examiner* — Peguy Jean Pierre
(74) *Attorney, Agent, or Firm* — Schwabe, Williamson & Wyatt, P.C.

(57) ABSTRACT

Embodiments disclosed herein include a method of calibrating a tool for converting photonic signals to electrical signals. In an embodiment, the method comprises connecting a calibration module to a calibrated current source, finding a transfer function for a plurality of modes with the calibration module, and storing the transfer functions in a lookup table.

24 Claims, 7 Drawing Sheets

ALGORITHM FOR ACCURATELY CONVERTING A WIDE RANGE OF PHOTO SIGNALS INTO AN ELECTRICAL CURRENT

BACKGROUND

1) Field

Embodiments relate to the field of semiconductor manufacturing and, in particular, to processes and apparatuses for calibrating pyrometers and emissometers.

2) Description of Related Art

Temperature control is a critical parameter for may processing operations in the semiconductor industry. For example, temperature control across the surface of a substrate (e.g., a silicon wafer) is critical in order to obtain process uniformity in applications such as thermal oxidation, thermal heat treatments, and the like. Due to the complexity of semiconductor processing tools, the temperature readings for such processes are typically implemented with a contactless temperature measurement system. Contactless measurement tools may include pyrometers, emissometers, and the like. Generally, the temperature measurement tools include photodiodes that receive an optical signal from the surface of the substrate being measured. For example, an infrared signal may be received by the photodiodes.

Typically, the photocurrent is converted into a digital (electrical) signal. In semiconductor processing, the photocurrent has a large range. For example, the photocurrent may span multiple magnitudes (e.g., ten magnitudes). In a particular instance, the photocurrent may span between $10^{-14}$ Amps (A) and $10^{-4}$ A. The analog to digital converter (ADC) used with such systems may have high resolutions, but the ADC is limited in sensitivity across the entire dynamic range of the ADC.

SUMMARY

Embodiments disclosed herein include a method of calibrating a tool for converting photonic signals to electrical signals. In an embodiment, the method comprises connecting a calibration module to a calibrated current source, finding a transfer function for a plurality of modes with the calibration module, and storing the transfer functions in a lookup table.

In an embodiment, a tool for converting a photonic signal to an electrical signal is provided. In an embodiment, the tool comprises a photodiode, a signal scaling module, an ADC, a selector module, and a current calculation module.

In an embodiment, a method of converting a photonic signal to an electrical signal comprises receiving an optical signal with an ADC, selecting a mode based on a location of the optical signal within a dynamic range of the ADC, setting an integration time and a range for the mode, and calculating an electrical current based on a transfer function for the mode.

DETAILED DESCRIPTION

Systems described herein include processes and apparatuses for calibrating pyrometers and emissometers. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, contactless temperature measurement solutions are used in order to provide improved process uniformity across the surface of a substrate. Contactless temperature measurement solutions may include emissometers and pyrometers. As used herein, any reference to one of an emissometer or a pyrometer may be considered as also including both emissometers and pyrometers. That is, embodiments described herein are applicable to both emissometers and pyrometers.

Generally, contactless temperature measurement solutions include an analog to digital converter (ADC). The ADC may have a high resolution, but lacks in sensitivity over the entire dynamic range. As such, embodiments disclosed herein include pyrometer and/or emissometer solutions that include hardware, firmware, and/or software that allows for an internal calibration process to be implemented. For example, the dynamic range of the ADC may be utilized with a plurality of modes. Each mode may include an integration time and a range. The integration time may be the integration time set for the ADC to record values, and the range may be a value that is used by a signal scaling module. In an embodiment, each mode may be associated with a transfer function that includes two or more coefficients (e.g., coefficients k and b). When a particular mode is selected, the associated transfer function coefficients are used in order to calculate the calibrated current. For example, the coefficient k may be multiplied by the ADC value, and the coefficient b may be an offset. In some embodiments, a dark current value may also be used in order to more accurately measure the temperature.

Figure 1:
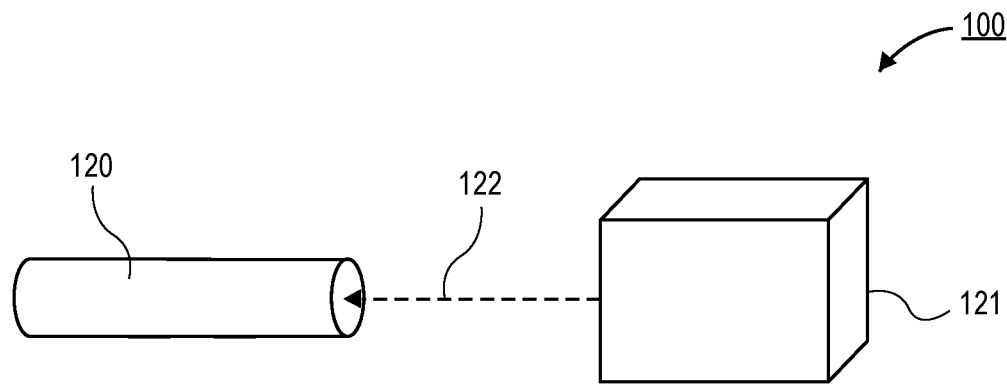
FIG. 1 is an illustration of a pyrometer measuring the temperature of a thermal body with a contactless solution, in accordance with an embodiment.

Referring now to FIG. 1, an illustration of a processing system 100 is shown, in accordance with an embodiment. The processing system 100 may include a pyrometer 120 and a thermal body 121. The pyrometer 120 uses a contactless measurement process in order to measure the temperature of the thermal body 121. For example, thermal energy 122 (e.g., infrared electromagnetic radiation) may be emitted by the thermal body 121 and propagated towards the pyrometer 120. The pyrometer 120 may include one or more photodiodes in order to convert the optical thermal energy 122 into a digital signal that can be used to calculate the temperature of the thermal body 121. As will be described in greater detail below, the pyrometer 120 may include an integrated calibration module in order to properly calibrate the pyrometer 120.

In an embodiment, the thermal body 121 may include any number of components that are used in semiconductor manufacturing processes. For example, the thermal body 121 may be a semiconductor substrate, such as a silicon wafer, or any other semiconductor wafer. In other embodiments, the thermal body 121 may be a glass substrate, a ceramic substrate, or the like. Temperatures of components of semiconductor processing tools may also be measured with pyrometers described herein. For example, thermal bodies 121 may include chamber lids, chucking surfaces, or the like. More generally, the thermal body 121 may be any object for which a temperature is desired to be measured. That is, pyrometers 120 disclosed herein are not limited to semiconductor processing environments.

In an embodiment, the pyrometer 120 may be integrated in a semiconductor processing tool. For example, rapid thermal processing (RTP) chambers, such as thermal oxidation chambers, may utilize one or more pyrometers 120. Though, it is to be appreciated that any type of semiconductor processing tool may benefit from contactless temperature measurement provided by pyrometers 120 described herein. An example of a particular processing chamber that utilizes one or more pyrometers 120 is shown in greater detail below with respect to FIG. 7.

Figure 2A:
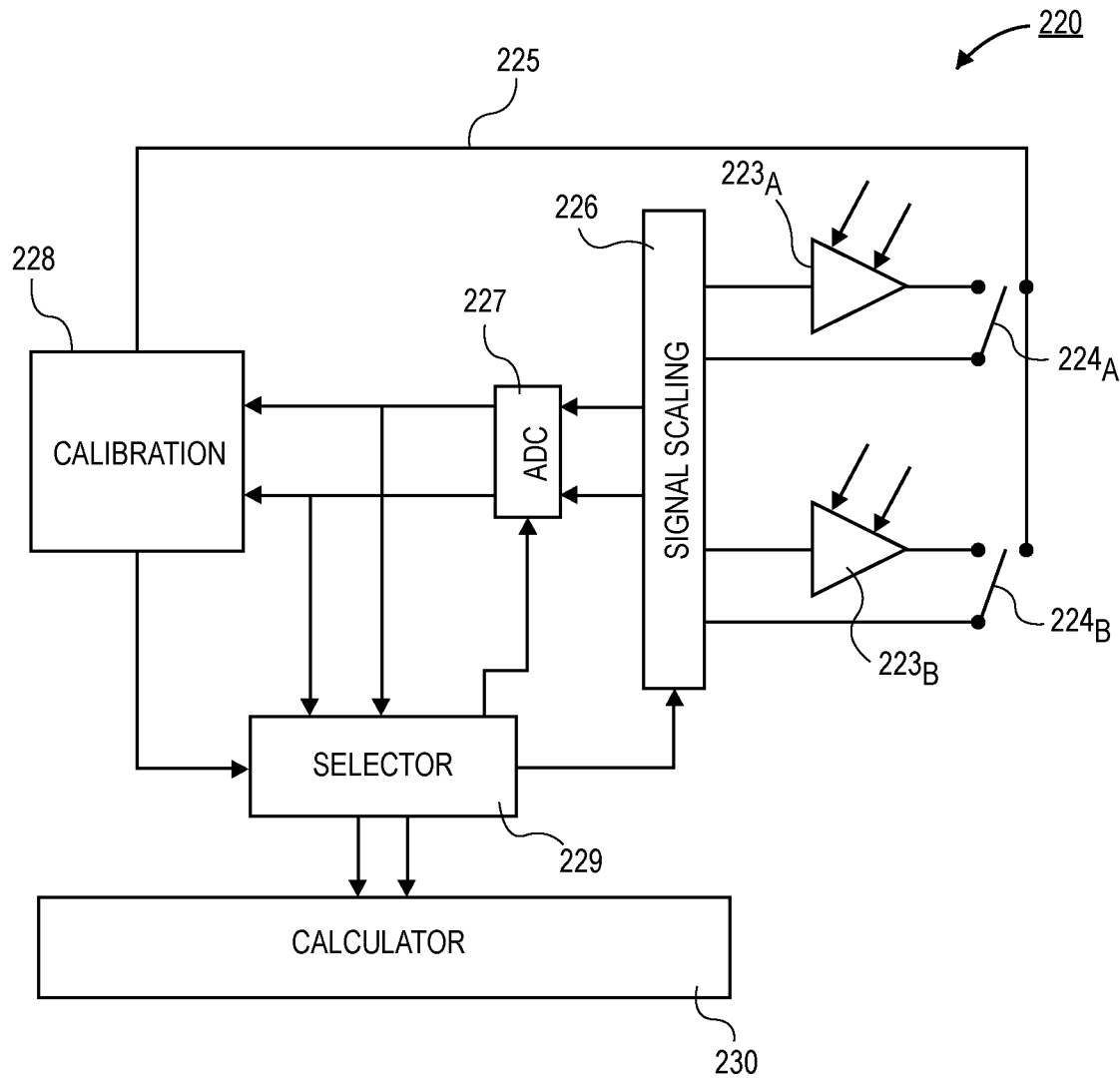
FIG. 2A is an illustration of various modules in a pyrometer that includes an integrated calibration module for a pair of photodiodes, in accordance with an embodiment.

Referring now to FIG. 2A, a schematic illustration of a pyrometer 220 is shown, in accordance with an embodiment. In an embodiment, the pyrometer 220 may include a pair of photodiodes $223_A$ and $223_B$. The photodiodes 223 may be suitable for converting an optical signal into an electrical signal. For example, the photodiodes $223_A$ and $223_B$ may be configured to detect infrared electromagnetic radiation emitted by thermal bodies, such as semiconductor wafers.

In an embodiment, the photodiodes 223 may be coupled to a measurement system. The measurement system may include a signal scaling module 226 and an ADC 227. In the illustrated embodiment, a single scaling module 226 and ADC 227 are shown. However, in other embodiments, each photodiode 223 may be coupled to different signal scaling modules 226 and ADCs 227. In an embodiment, the signal scaling module 226 may be responsible for altering (e.g., amplifying) the signal provided by the photodiode 223 before it reaches the ADC 227. The ADC 227 may have any suitable ADC architecture, sampling rate, dynamic range, or the like.

The pyrometer 220 may further comprise a calibration module 228. That is, the calibration module 228 may be integrated into the pyrometer 220 itself. Generally, the calibration module 228 is used by engaging a switch $224_A$ or $224_B$ to a calibrated current source 225. The calibrated current source 225 may include a battery or the like. The calibrated current source 225 may then be used in order to formulate a transfer function for each mode of operation of the ADC 227. For example, each mode may include a integration time for the ADC 227 and a range for the signal scaling module 226. The transfer function may include two coefficients that are used to calculate an accurate temperature report. After calibration is complete, the switches $224_A$ and $224_B$ may be switched off from the calibrated current source 225, in order to return the input to the signal from the photodiodes $223_A$ and $223_B$. A more detailed explanation of the calibration system and a method for calibrating the pyrometer 220 are described in greater detail below.

In an embodiment, the pyrometer 220 may further comprise a selector 229. The selector 229 may be used in order to select the mode used to operate the ADC 227 and the signal scaling module 226. The selector 229 may choose the mode based on different parameters. In one embodiment, the selector 229 may choose a mode to provide the best performance for the ADC 227 coupled to the first photodiode $223_A$, or to provide the best performance for the ADC 227 coupled to the second photodiode $223_B$. In other embodiments, the selector 229 may use either the first photodiode $223_A$ or the second photodiode $223_B$. For example, whichever photodiode 223 has the highest or lowest signal strength may be used in order to select the desired mode.

In an embodiment, the pyrometer 220 may also include a calculator module 230. The calculator module 230 may use the transfer function for a given mode in order to generate an accurate report of the temperature observed by the pyrometer. In an embodiment, the transfer function is stored in a lookup table or memory (not shown) on the pyrometer 220. The transfer function may include a first coefficient (k) that is multiplied by the ADC 227 reading, and a second coefficient (b) that is an offset value. The calculator module 230 may take the form of I=k*ADC+b.

In some embodiments, a dark current value may also be stored in a lookup table or a memory. The dark current may be subtracted from the calculated value in order to determine an accurate value of the temperature. In such embodiment, the calculator module 230 may take the form of I=k*ADC+b−dark current. The dark current may be a value of the current that flows through the pyrometer 220 when the pyrometer 220 is in a dark environment. That is, in the case of a photodiode 223 tuned to detect infrared radiation, the photodiode 223 may be placed in an enclosure that is opaque to infrared radiation in order to measure the dark current. Without subtracting the dark current, noise in the system may result in inaccurate temperature readings. The dark current may be mode independent.

Figure 2B:
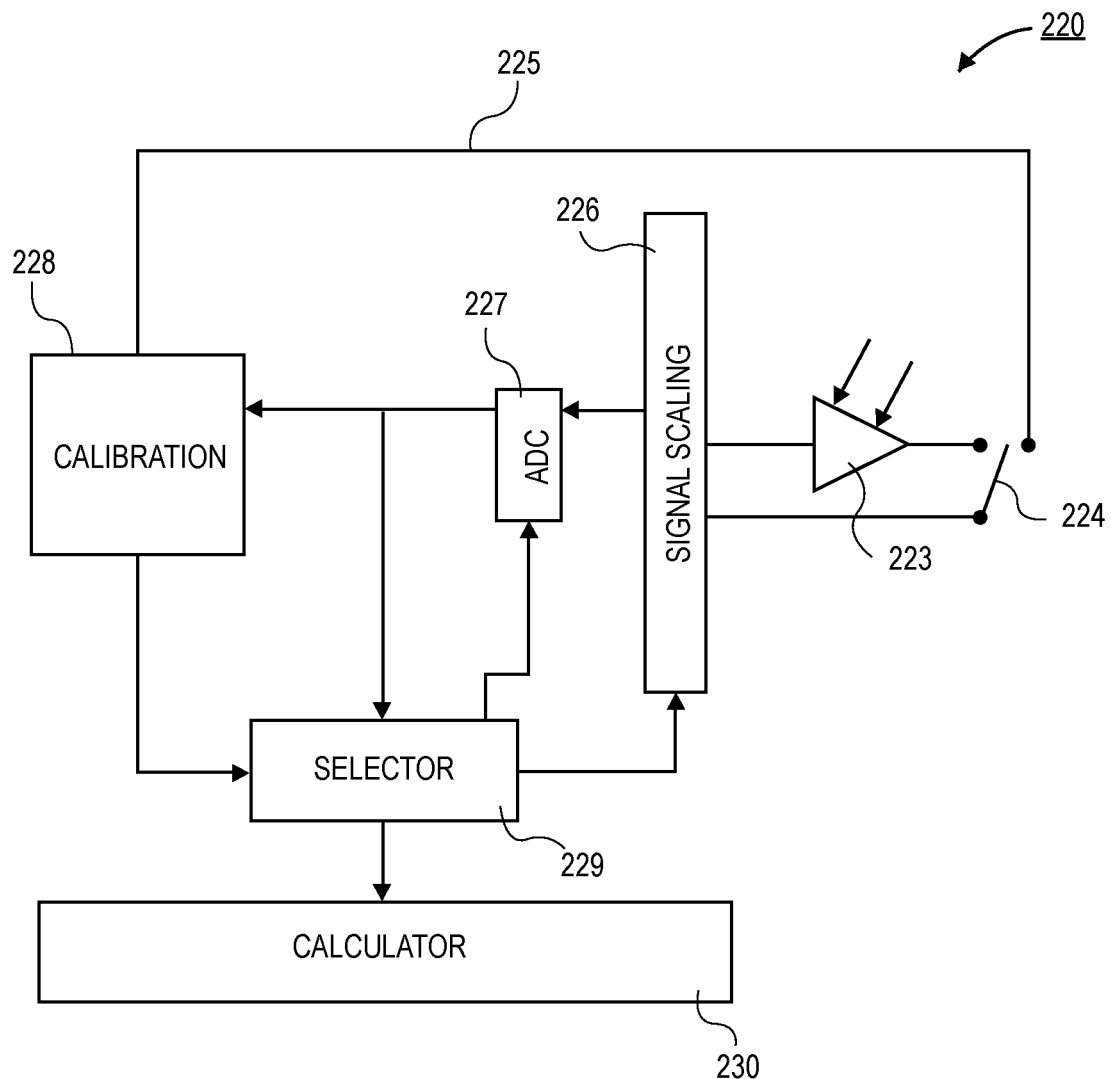
FIG. 2B is an illustration of various modules in a pyrometer that includes an integrated calibration module for a single photodiode, in accordance with an embodiment.

Referring now to FIG. 2B, a schematic illustration of a pyrometer 220 is shown, in accordance with an additional embodiment. The pyrometer 220 in FIG. 2B may be substantially similar to the pyrometer 220 in FIG. 2A, with the exception of the number of photodiodes 223. Instead of two photodiodes $223_A$ and $223_B$ there is only a single photodiode 223. While examples of one photodiode 223 and two photodiodes $223_A$ and $223_B$ are shown, it is to be appreciated that the pyrometer 220 may have any number of photodiodes 223 (e.g., one or more photodiodes).

In the illustrated embodiment with a single photodiode 223, the selector 229 is less complicated. Instead of needing to select between two photodiodes 223, the selector 229 only needs to consider a single photodiode 223. As such, the mode selected by the selector 229 will optimize performance for the single photodiode 223. Further, since only a single photodiode 223 is provided, the connections between components are reduced since only a single channel is necessary.

Figure 3:
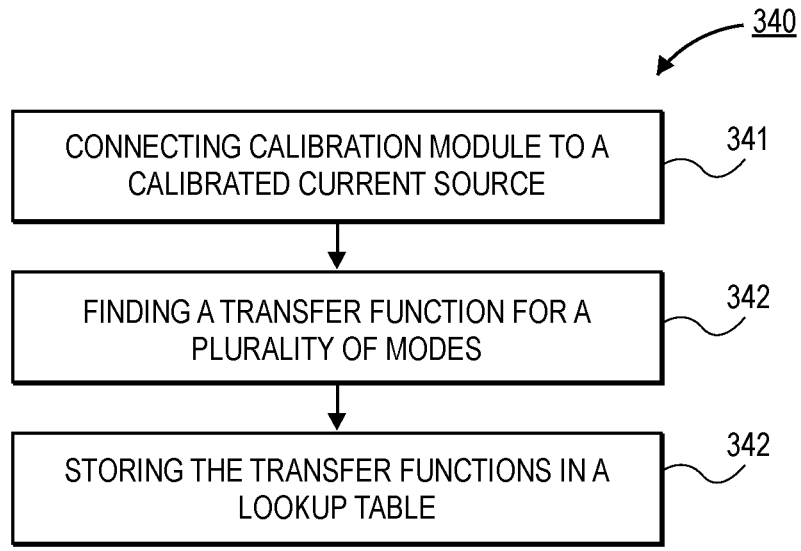
FIG. 3 is a process flow diagram of a process for calibrating a pyrometer, in accordance with an embodiment.

Referring now to FIG. 3, a process flow diagram of a process 340 for calibrating a pyrometer is shown, in accordance with an embodiment. In an embodiment, the pyrometer that is being calibrated may include one or more photodiodes, such as the examples described in greater detail above. Additionally, the calibration hardware, firmware, and/or software may be integrated within the pyrometer.

In an embodiment, the process 340 may begin with operation 341, which comprises connecting a calibration module to a calibrated current source. In an embodiment, the input line to the calibration module may be implemented by a switch. During calibration operations, the switch may be positioned so that the input line is electrically coupled to the calibrated current source. In an embodiment, the calibrated current source is a current source that has a known current. In an embodiment, the calibrated current source may be implemented with the use of a battery that is integrated with the pyrometer. However, in other embodiments, the current source may be provided external to the pyrometer. In an embodiment, the calibrated current source may provide a single current value. In other embodiments, the calibrated current source may be configured to provide multiple different current values. The use of a calibrated current source allows for the calibration module to know what the input current should be so that effects (noise, etc.) attributable to the circuitry of the pyrometer can be determined.

In an embodiment, the process 340 may continue with operation 342, which comprises finding a transfer function for a plurality of modes. In an embodiment, each mode may correspond to the pairing of an integration time for the ADC with a range for the signal scaling module. A plurality of modes are used in order to improve the sensitivity of the ADC through an entire dynamic range of the ADC. The selector will choose a specific mode depending on where within the dynamic range of the ADC that a signal lies. In an embodiment, the transfer function for each mode may include a pair of coefficients. A first coefficient (k) will be multiplied by the ADC output, and a second coefficient (b) is an offset value.

In an embodiment, the transfer function may be calculated with any known processing operations. For example, the transfer function may be the pair of coefficients (k and b) that result in the measured current being equal to the current of the calibrated current source. In this way, the effects of the circuitry, modules, and components on the output can be accounted for in order to provide more accurate temperature measurements. Additionally, it is to be appreciated that the circuitry, modules, and components may have different effects depending on the amount of current provided through the system. Accordingly, the different modes are used in order to calibrate for the entire dynamic range of the ADC.

In an embodiment, the process 340 may continue with operation 343, which comprises storing the transfer functions in a lookup table. In an embodiment, the transfer functions may be stored in a lookup table that is provided in a memory accessible to the pyrometer. For example, a memory die or other memory architectures may be integrated into the pyrometer. That is, a source of memory may be provided on the board that houses the electronics for the pyrometer.

Figure 4:
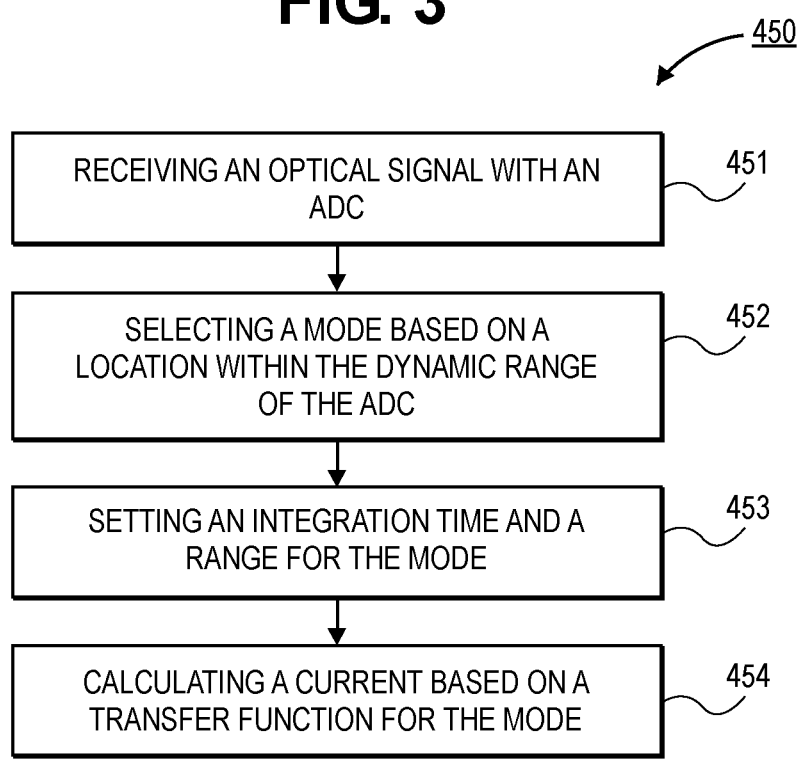
FIG. 4 is a process flow diagram of a process for using a calibrated pyrometer, in accordance with an embodiment.

Referring now to FIG. 4, a process flow diagram of a process 450 for measuring a temperature with a pyrometer is shown, in accordance with an embodiment. In an embodiment, the pyrometer may be similar to any of the pyrometers described in greater detail herein. More particularly, the pyrometer may be a pyrometer that includes an integrated calibration module in order to provide improved calibration of the pyrometer.

In an embodiment, process 450 may begin with operation 451, which comprises receiving an optical signal with an ADC. In an embodiment, the optical signal may first be processed with a photodiode. The photodiode may convert an optical signal (e.g., an infrared signal) into an electrical signal. The electrical signal may then be passed through a signal scaling module before reaching the ADC. In an embodiment, the pyrometer includes a single photodiode. In other embodiments, the pyrometer may include two or more photodiodes. In such embodiments, each photodiode may report an electrical signal to different channels of the ADC, or to two different ADCs.

In an embodiment, process 450 may continue with operation 452, which comprises selecting a mode based on a location of the electrical signal within a dynamic range of the ADC. That is, the dynamic range of the ADC may be segmented into a plurality of discrete sections. The segmentation of the dynamic range allows for different parameters to be applied to the signal in order to optimize the accuracy and sensitivity of the ADC. In an embodiment, the mode may include an integration time for the ADC and a range for the signal scaling module.

In an embodiment, the mode may be selected based on the output of the channel of the ADC coupled to a first photodiode, or based on the output of the channel of the ADC coupled to a second photodiode. In other embodiments, the mode may be selected based on which ADC channel is the highest or the lowest. It is to be appreciated that while separate channels of a single ADC are contemplated herein, similar embodiments may be used when each photodiode has a separate ADC.

In an embodiment, process 450 may continue with operation 453, which comprises setting an integration time and a range for the mode. In an embodiment, the integration time may be applied to the ADC and the range may be applied to the signal scaling module. The values for the integration time and the range may be stored in a memory integrated into the pyrometer.

In an embodiment, process 450 may continue with operation 454, which comprises calculating a current based on a transfer function for the mode. The transfer function for the mode may be stored in a lookup table. The transfer function may be determined using a calibration process, such as the process described in greater detail above. The transfer function may include a pair of coefficients (k and b). In an embodiment, the calculation may include using the coefficients to calculate the current. For example, the equation may be as follows: $I=k*ADC+b$.

In some embodiments the calculation may further comprise an adjustment for dark current in the system. In such an embodiment, the equation may be as follows: $I=k*ADC+b-\text{dark current}$. The dark current value may also be stored in a lookup table. The dark current may be determined during calibration of the pyrometer, assembly of the pyrometer, or at any other time.

Figure 5:
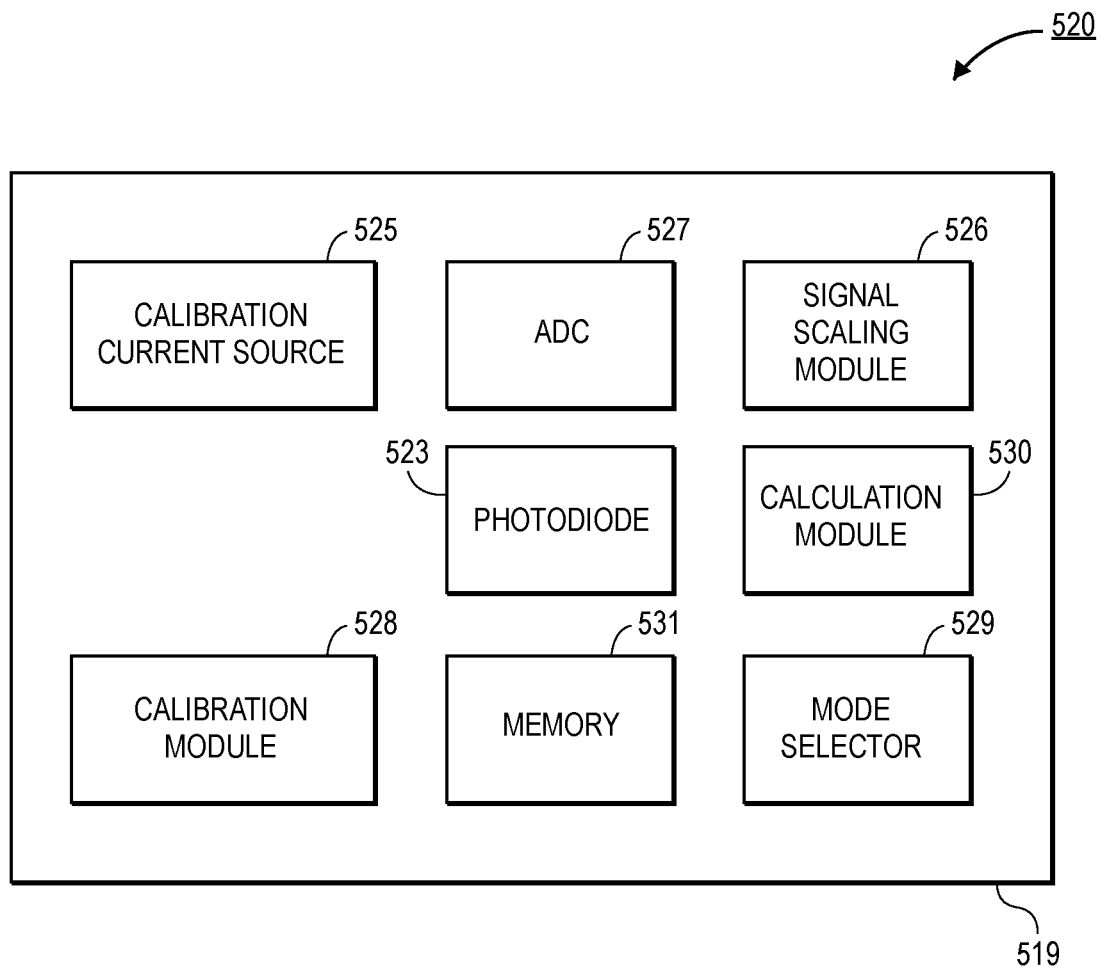
FIG. 5 is a block diagram of a pyrometer that includes an integrated calibration module, in accordance with an embodiment.

Referring now to FIG. 5, a plan view illustration of a pyrometer 520 is shown, in accordance with an embodiment. In an embodiment, the pyrometer 520 may comprise a board 519. The board 519 may be a printed circuit board or the like. In an embodiment, a plurality of modules and/or components may be coupled to the board 519.

In an embodiment, a photodiode 523 may be provided on the board 519. The photodiode 523 may include optics in order to detect an optical signal (e.g., an infrared electromagnetic radiation signal) from a thermal body. In the illustrated embodiment, a single photodiode 523 is shown. However, it is to be appreciated that embodiments may include two or more photodiodes 523. The photodiode 523 converts the optical signal into an electrical signal.

In an embodiment, the pyrometer 520 may further comprise a signal scaling module 526 and an ADC 527. The signal scaling module 526 and the ADC 527 may be used to convert the electrical analog signal into a digital signal that can be used to calculate the current obtained by the photodiode 523. The signal scaling module 526 and the ADC 527 may include multiple channels in order to accommodate multiple photodiodes 523.

In an embodiment, the pyrometer 520 may include a mode selector module 529. The mode selector module 529 may be used in order to select the proper mode in order to accurately measure the signal from the photodiode 523. The mode may include an integration time for the ADC 527 and a range for the signal scaling module 526. The integration time for the ADC 527 and the range for the scaling module 526 may be stored in a lookup table accessible to the mode selector 529. For example, the lookup table may be provided in the memory 531.

In an embodiment, the pyrometer 520 may further comprise a calibration module 528. The calibration module 528 is used in order to calibrate the signals obtained from the photodiode 523. The calibration module 528 may generate a plurality of transfer functions. Each transfer function may be associated with one of the modes described above. The transfer function may include a pair of coefficients (k and b). The coefficients may be used by a calculator module 530 in order to calculate the calibrated value of the current using equations, such as those described in greater detail above.

In an embodiment, the calibration module 528 may be configured to be selectively coupled to a calibration current source 525. The calibration current source 525 may provide a known value of current in order to aid in the calibration of the pyrometer 520. Particularly, the calibration module 528 has a known current from the calibration current source 525 and receives an input current from the system that passes through the circuitry of the pyrometer 520. The difference between the calibration current and the input current can then be determined and the calibration module 528 generates coefficients for a transfer function to convert the input current into a value equal to the calibration current. In an embodiment, the calibration current source 525 provides a single current. In other embodiments, the calibration current source 525 is capable of providing multiple different current values.

Figure 6:
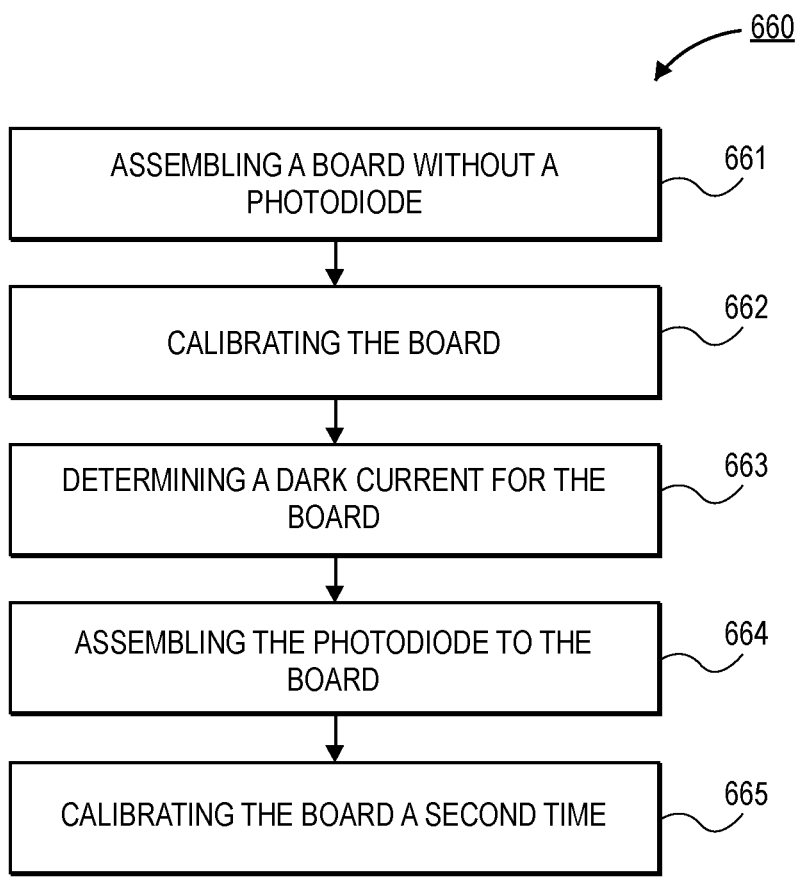
FIG. 6 is a process flow diagram of a process for assembling and calibrating a pyrometer, in accordance with an embodiment.

Referring now to FIG. 6, a process flow diagram of a process 660 for assembling a pyrometer is shown, in accordance with an embodiment.

In an embodiment, process 660 may begin with operation 661, which comprises assembling a board without a photodiode. The board may include components or modules, such as a signal scaling module, an ADC, a calibration module, a calibration current source, a selector module, and a calculator module.

In an embodiment, process 660 may continue with operation 662, which comprises calibrating the board. The calibration may be similar to any of the calibration processes described in greater detail above. For example, the calibration current source may supply an input current with a known value that passes through the electronics to the calibration module. The calibration module detects a level of the current and compares that level to the known calibration current level. The calibration module then develops a transfer function with coefficients (k and b) that are used to convert the measured current to the known calibration current. The transfer function is then stored in a lookup table for use during operation of the pyrometer.

In an embodiment, process 660 may continue with operation 663, which comprises determining a dark current for the board. The dark current may be measured by supplying a temporary photodiode to the board and measuring the resulting current that is provided through the system when the pyrometer is placed in a dark enclosure (e.g., that is opaque to infrared radiation). The value of the dark current may be stored in the lookup table of the pyrometer. After the dark current is determined, the temporary photodiode may be removed. In an embodiment, the dark current is independent of the mode.

In an embodiment, process 660 may continue with operation 664, which comprises assembling the photodiode to the board. The photodiode may be attached to the board in a different physical location than where the remainder of the board is assembled. For example, the partially assembled board may be assembled at a first facility and the photodiode may be assembled to the board at a second facility.

In an embodiment, process 660 may continue with operation 665, which comprises calibrating the board a second time. In an embodiment, the second calibration may be used to check the electronics and ensure that everything is working properly. The second calibration process may not use the calibration module in some embodiments.

Figure 7:
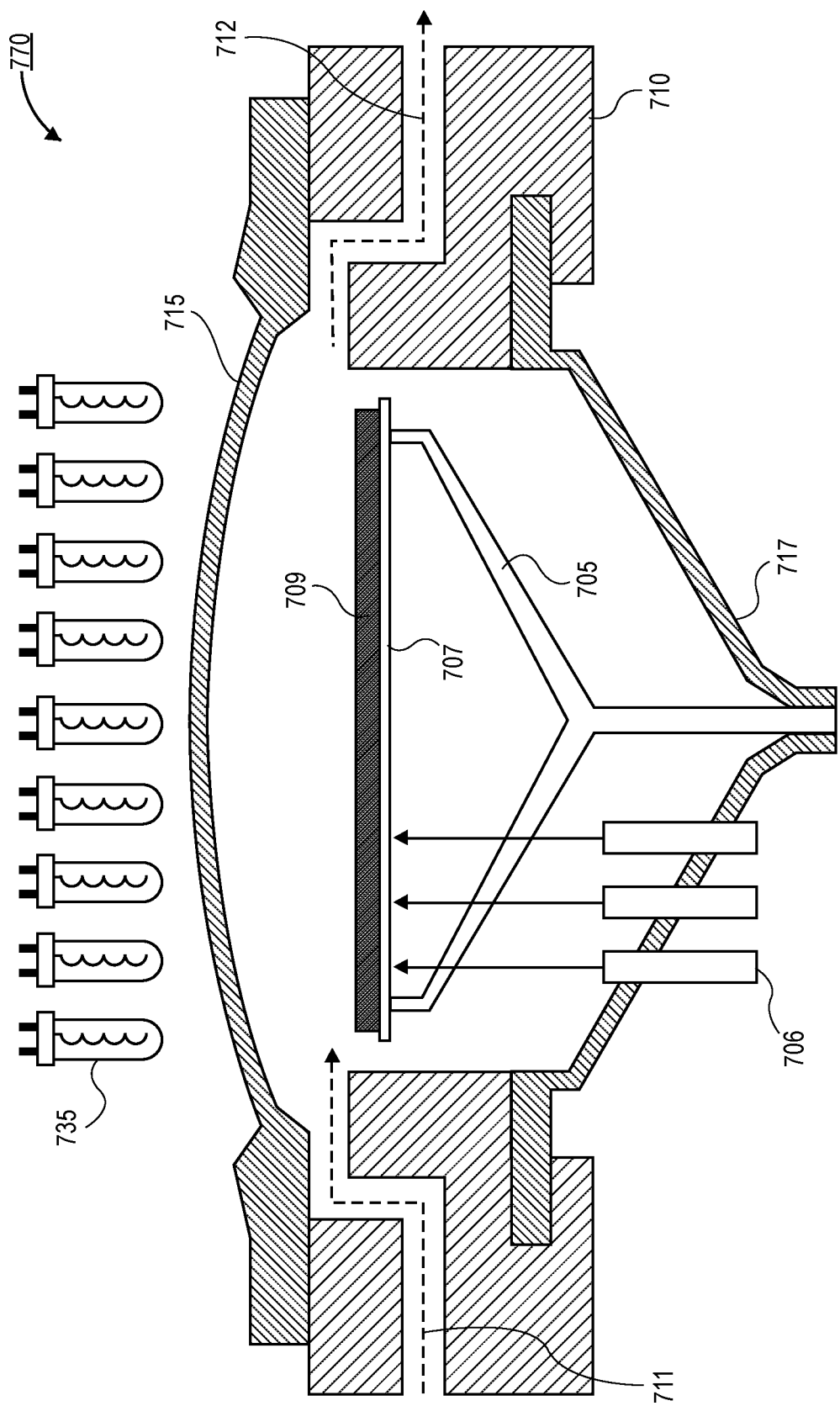
FIG. 7 is a cross-sectional illustration of a semiconductor processing tool that includes one or more pyrometers, in accordance with an embodiment.

Referring now to FIG. 7, a cross-sectional illustration of a processing chamber 770 is shown, in accordance with an embodiment. In an embodiment, the chamber 770 may comprise any type of semiconductor manufacturing chamber that may require precise substrate temperature control. In the illustrated embodiment, a chamber 770 without plasma capability is shown. However, it is to be appreciated that the chamber 770 may also comprise the capability to use a plasma in order to implement various processing regimes.

In an embodiment, the chamber 770 may comprise a chamber body 710. The chamber body 710 may include any suitable material, such as stainless steel, or the like. In an embodiment, a coating (not shown) may be provided over an interior surface of the chamber body 710. For example, the coating may be a chamber seasoning or protection layer. In an embodiment, gas 711 may enter the chamber 770 through a first portion of the chamber body 710, and gas 712 may exit the tool through a second portion of the chamber body 710. While the gas 711 and 712 are shown entering and exiting through the chamber body 710, it is to be appreciated that the gas may enter or exit the chamber through any portion of the chamber 770, depending on the type of chamber 770 that is being used.

In an embodiment, a substrate support 705 and a susceptor 707 are provided in the chamber. The substrate support 705 and the susceptor 707 are configured to hold and/or secure a substrate 709. For example, the substrate 709 may be a semiconductor substrate, such as a silicon wafer. The substrate 709 may have any suitable form factor. For example, a diameter of the substrate 709 may be 300 mm, 450 mm, or any standard wafer form factor. Additionally, other substrates 709 may be used in the chamber 770. For example, glass substrates, ceramic substrates, or the like may also be used in some embodiments. In an embodiment, the substrate support 705 and the susceptor 707 may be configured to rotate. The rotation allows for improved temperature uniformity across the substrate 709.

The susceptor 707 may include any type of chucking architecture in order to secure the substrate 709. In some embodiments, the susceptor 707 may include an electrostatic chucking (ESC) architecture. In such an embodiment, the substrate 709 is secured to the susceptor 707 by an electrostatic force. Other embodiments may include a vacuum chucking architecture for the susceptor 707. In an embodiment, the susceptor 707 and the substrate support 705 may comprise a quartz material or another material that is at least substantially transparent to infrared radiation. As such, a temperature of the backside surface of the substrate 709 can obtained by pyrometers 706.

In an embodiment, the chamber 770 may include a lid 715. The lid 715 may sometimes be referred to as a chamber dome. While shaped as a dome, it is to be appreciated that lid 715 may have any architecture (e.g., a flat surface or the like). The lid 715 may be formed from a material that is at least substantially transparent to infrared radiation. For example, the lid 715 may comprise quartz or the like.

In an embodiment, the chamber 770 may also include a bottom lid 717. The bottom lid 717 may cover a bottom surface of the chamber 770. The bottom lid 717 may comprise a material that is at least substantially transparent to infrared radiation. As such, pyrometers 706 on the bottom side of the chamber 770 can be used to measure a temperature of a bottom surface of the substrate 709. In an embodiment, the bottom lid 717 may be coupled to the substrate support 705. More particularly, the substrate support 705 may pass through the bottom lid 717. The bottom lid 717 is coupled to the substrate support 705 in a configuration that allows for the substrate support 705 to freely rotate.

In an embodiment, a plurality of lamps 735 may be provided outside the internal volume of the chamber 770. The internal volume of the tool may refer to the volume defined by the lid 715, the chamber body 710, and the bottom lid 717. That is, the lamps 735 are not provided within the internal volume of the chamber 770 where the substrate processing is implemented. In an embodiment, the plurality of pyrometers 706 may be provided through the bottom lid 717. The pyrometers 706 may be focused onto the backside surface of the substrate 709. In an embodiment, the pyrometers 706 may be similar to any of the pyrometers described in greater detail herein. For example, the pyrometers 706 may include an internal calibration module.

Figure 8:
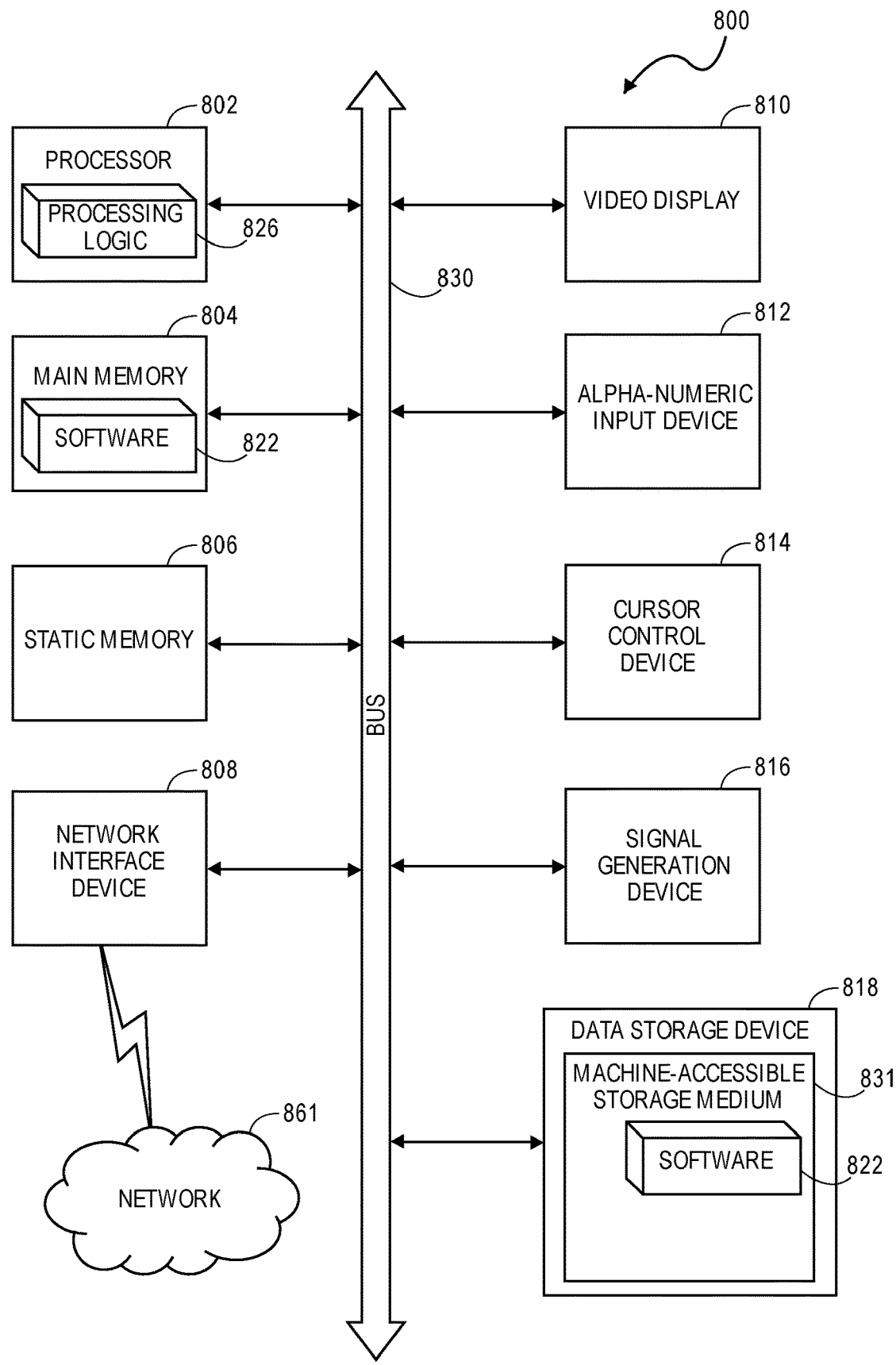
FIG. 8 illustrates a block diagram of an exemplary computer system that may be used in conjunction with a processing tool, in accordance with an embodiment.

Referring now to FIG. 8, a block diagram of an exemplary computer system 800 of a processing tool is illustrated in accordance with an embodiment. In an embodiment, computer system 800 is coupled to and controls processing in the processing tool. Computer system 800 may be connected (e.g., networked) to other machines in a Local Area Network (LAN), an intranet, an extranet, or the Internet. Computer system 800 may operate in the capacity of a server or a client machine in a client-server network environment, or as a peer machine in a peer-to-peer (or distributed) network environment. Computer system 800 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 800, the term "machine" shall also be taken to include any collection of machines (e.g., computers) that individually or jointly execute a set (or multiple sets) of instructions to perform any one or more of the methodologies described herein.

Computer system 800 may include a computer program product, or software 822, having a non-transitory machine-readable medium having stored thereon instructions, which may be used to program computer system 800 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 800 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 800 may further include a system network interface device 808 for communicating with other devices or machines. The computer system 800 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 832 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 800, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of calibrating a tool for converting photonic signals to electrical signals, comprising:
    connecting a calibration module to a calibrated current source;
    finding a transfer function for a plurality of modes with the calibration module, wherein individual ones of the plurality of modes comprise an integration time and a range; and
    storing the transfer functions in a lookup table.

2. The method of claim 1, wherein the integration time is supplied to an ADC in the tool, and wherein the range is supplied to a signal scaling module in the tool.

3. The method of claim 1, wherein the transfer function comprises a first coefficient and a second coefficient, wherein the first coefficient is multiplied by an ADC value, and the second coefficient is an offset value.

4. The method of claim 1, wherein the calibration further comprises, finding a dark current of the tool.

5. The method of claim 1, wherein the tool is a pyrometer or an emissometer.

6. A tool for converting a photonic signal to an electrical signal, comprising:
    a photodiode;
    a signal scaling module;
    an ADC;
    a selector module, wherein the selector module is configured to select a mode to operate the ADC and the signal scaling module; and
    a current calculation module.

7. The tool of claim 6, wherein the mode comprises an integration time for the ADC and a range for the signal scaling module.

8. The tool of claim 6, further comprising:
    a second photodiode.

9. The tool of claim 8, wherein the selector module is configured to select a mode to operate the ADC and the scaling module based on the ADC value of the photodiode or the ADC value of the second photodiode.

10. The tool of claim 8, wherein the selector module is configured to select a mode to operate the ADC and the scaling module based on which ADC value is higher, wherein the ADC value comprises a first ADC value for the photodiode and a second ADC value of the second photodiode.

11. The tool of claim 6, further comprising:
    a calibration module.

12. The tool of claim 11, further comprising:
    an internal source of a calibrated current.

13. The tool of claim 12, wherein the calibration module calibrates the tool when the calibration module is connected to the internal source of the calibrated current.

14. The tool of claim 6, wherein the tool is a pyrometer or an emissometer.

15. A method of converting a photonic signal to an electrical signal, comprising:
    receiving an optical signal with an ADC;
    selecting a mode based on a location of the optical signal within a dynamic range of the ADC;
    setting an integration time and a range for the mode; and
    calculating an electrical current based on a transfer function for the mode.

16. The method of claim 15, wherein the transfer function comprises a first coefficient and a second coefficient that are stored in a lookup table.

17. The method of claim 15, wherein calculating the electrical current further comprises subtracting a dark current from the electrical current.

18. The method of claim 15, further comprising:
    receiving a second optical signal with the ADC, and wherein selecting the mode further comprises selecting a mode based on the second optical signal or the optical signal depending on which optical signal is larger.

19. A method of calibrating a tool for converting photonic signals to electrical signals, comprising:
    connecting a calibration module to a calibrated current source;
    finding a transfer function for a plurality of modes with the calibration module, wherein the transfer function comprises a first coefficient and a second coefficient, wherein the first coefficient is multiplied by an ADC value, and the second coefficient is an offset value; and
    storing the transfer functions in a lookup table.

20. A method of calibrating a tool for converting photonic signals to electrical signals, comprising:
    connecting a calibration module to a calibrated current source;
    finding a transfer function for a plurality of modes with the calibration module; and
    storing the transfer functions in a lookup table; and
    finding a dark current of the tool.

21. A tool for converting a photonic signal to an electrical signal, comprising:
    a first photodiode and a second photodiode;
    a signal scaling module;
    an ADC;
    a selector module; and
    a current calculation module, wherein the selector module is configured to select a mode to operate the ADC and the scaling module based on the ADC value of the first photodiode or the ADC value of the second photodiode.

22. A tool for converting a photonic signal to an electrical signal, comprising:
    a first photodiode and a second photodiode;
    a signal scaling module;
    an ADC;
    a selector module; and
    a current calculation module, wherein the selector module is configured to select a mode to operate the ADC and the scaling module based on which ADC value is higher, wherein the ADC value comprises a first ADC value for the first photodiode and a second ADC value of the second photodiode.

23. A tool for converting a photonic signal to an electrical signal, comprising:
    a photodiode;
    a signal scaling module;
    an ADC;
    a selector module;
    a current calculation module;
    a calibration module; and
    an internal source of a calibrated current.

24. The tool of claim 23, wherein the calibration module calibrates the tool when the calibration module is connected to the internal source of the calibrated current.

* * * * *